United States Patent
England et al.

(10) Patent No.: US 10,224,286 B1
(45) Date of Patent: Mar. 5, 2019

(54) INTERCONNECT STRUCTURE WITH ADHESIVE DIELECTRIC LAYER AND METHODS OF FORMING SAME

(71) Applicant: GLOBALFOUNDRIES INC., Grand Cayman (KY)

(72) Inventors: Luke G. England, Saratoga Springs, NY (US); Kenneth J. Giewont, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/883,693

(22) Filed: Jan. 30, 2018

(51) Int. Cl.
*H01L 23/538* (2006.01)
*H01L 23/49* (2006.01)
*H01L 21/768* (2006.01)
*H01L 21/48* (2006.01)
*H01L 25/16* (2006.01)

(52) U.S. Cl.
CPC ........ *H01L 23/5384* (2013.01); *H01L 21/486* (2013.01); *H01L 21/768* (2013.01); *H01L 23/49* (2013.01); *H01L 25/167* (2013.01)

(58) Field of Classification Search
CPC . H01L 23/5384; H01L 21/486; H01L 21/768; H01L 23/49; H01L 25/167
See application file for complete search history.

(56) References Cited

U.S. PATENT DOCUMENTS

| | | | |
|---|---|---|---|
| 7,781,235 B2 * | 8/2010 | Luo | G01R 31/2886 257/E21.524 |
| 8,831,437 B2 | 9/2014 | Dobbelaere et al. | |
| 9,297,971 B2 | 3/2016 | Thacker et al. | |
| 2009/0244873 A1 | 10/2009 | Lu et al. | |

* cited by examiner

*Primary Examiner* — David Vu
(74) *Attorney, Agent, or Firm* — Anthony Canale; Hoffman Warnick LLC

(57) ABSTRACT

Embodiments of the disclosure provide an interconnect structure including: a first die having a first surface and an opposing second surface, and a groove within first surface of the first die; an adhesive dielectric layer mounted to the opposing second surface of the first die; a second die having a first surface mounted to the adhesive dielectric layer, and an opposing second surface, wherein the adhesive dielectric layer is positioned directly between the first and second dies; and a through-semiconductor via (TSV) including a first TSV metal extending from the first surface of the first die to the adhesive dielectric layer, and a second TSV metal substantially aligned with the first TSV metal and extending from the adhesive dielectric layer to the opposing second surface of the second die, wherein the TSV includes a metal-to-metal bonding interface between the first and second TSV metals within the adhesive dielectric layer.

12 Claims, 10 Drawing Sheets

INTERCONNECT STRUCTURE WITH ADHESIVE DIELECTRIC LAYER AND METHODS OF FORMING SAME

BACKGROUND

Technical Field

The present disclosure relates to interconnect structures adapted to hold photonic fibers therein. In particular, embodiments of the present disclosure include interconnect structures which include an adhesive dielectric layer for bonding multiple dies and increasing the total interconnect thickness, and methods of forming the same.

Related Art

In flip chip processing of semiconductor integrated circuit (IC) chips, metal contacts such as controlled collapse chip connect (C4) solder balls may be implemented to connect IC dies to packaging and/or to each other. When formed, each metal contact may provide an electrically conductive structure coupled between directly connected IC chips to serve as a mechanical and electrical connection between the two chips. These components may together define the IC "structure," i.e., the housing of a particular chip or device. The structure generally includes each element for electrically connecting a particular chip with outside circuitry, and also may be structured to include and/or be coupled to elements which provide physical and chemical protection to active elements of the chip.

Some products may include fibrous media, e.g., photonic fibers, configured to relay signals through light transmission. Semiconductor chips may be modified, adapted, etc., to house the various components needed to transmit light from one component to another. In some cases, a chip may include grooves shaped to house photonic fibers within the chip. These grooves may affect the structural integrity of the chip, e.g., by creating regions of reduced thickness. Conventional fabrication techniques may not fully account for the presence of such grooves in a product or precursor materials used to form the product.

SUMMARY

A first aspect of the disclosure provides an interconnect structure including: a first die having a first surface and an opposing second surface, and a groove within first surface of the first die; an adhesive dielectric layer mounted to the opposing second surface of the first die; a second die having a first surface mounted to the adhesive dielectric layer, and an opposing second surface, wherein the adhesive dielectric layer is positioned directly between the first and second dies; and a through-semiconductor via (TSV) including a first TSV metal extending from the first surface of the first die to the adhesive dielectric layer, and a second TSV metal substantially aligned with the first TSV metal and extending from the adhesive dielectric layer to the opposing second surface of the second die, wherein the TSV includes a metal-to-metal bonding interface between the first and second TSV metals within the adhesive dielectric layer.

A second aspect of the disclosure provides an interconnect structure including: a first die having a first surface and an opposing second surface, and a groove within the first surface of the first die; an adhesive dielectric layer mounted to the opposing second surface of the first die, wherein the adhesive dielectric layer includes: a first dielectric film bonded to the opposing second surface of the first die, and a second dielectric film bonded to the first dielectric film opposite the first die, wherein an adhesive bonding interface between the first and second dielectric films extends substantially in parallel with the opposing second surface of the first die; a first through-semiconductor via (TSV) metal extending from the first surface of the first die to the adhesive bonding interface of the adhesive dielectric layer; a second die having a first surface mounted on the second dielectric film of the adhesive dielectric layer, and an opposing second surface; and a second through-semiconductor via (TSV) metal substantially aligned with the first TSV metal and extending from the adhesive bonding interface of the adhesive dielectric layer to the opposing second surface of the second die, wherein a metal-to-metal bonding interface joins the first TSV metal to the second TSV metal.

A third aspect of the disclosure provides a method of forming an interconnect structure, the method including: providing a precursor structure including: a first die having a first surface and an opposing second surface, and a groove within first surface of the first die, a first through-semiconductor-via (TSV) metal within the first die, the first TSV metal having an exposed end at the opposing second surface of the first die, a first dielectric film mounted to the opposing second surface of the first die, and a first TSV bond pad positioned at the exposed end of the first TSV, and extending through the first dielectric film; providing an interposer structure including: a second die having a first surface and an opposing second surface, a second through-semiconductor-via (TSV) metal within the second die, the second TSV metal having an end at the opposing second surface of the second die, a second dielectric film mounted to the opposing second surface of the second die, and a second TSV bond pad positioned at the end of the second TSV, and extending through the second dielectric film; substantially aligning the first TSV bond pad of the precursor structure with the second TSV bond pad of the interposer structure; bonding the first dielectric film to the second dielectric film to form an adhesive dielectric layer between the first and second dies; and bonding the first TSV bond pad to the second TSV bond pad to form a single TSV extending through the first and second dies, wherein a metal-to-metal bonding interface of the single TSV between the first and second TSV bond pads is substantially coplanar with a bonding interface between the first and second dielectric films.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

The present disclosure relates to interconnect structures which may be suitable for use with photonic integrated circuit (PIC) dies. PIC dies may include wafers with grooves for holding a photonic fiber (e.g., a waveguide or similar photonic component). The size of such fibers relative to the size of a PIC die may affect the structural stability, manufacture, etc., of a product. According to an example, a photonic fiber may have a diameter of approximately one-hundred and twenty micrometers (μm). To hold a fiber of this size, a PIC die may include a groove with a depth of at least approximately seventy-five μm. A through-semiconductor-via (TSV) of the same PIC die may have a length of approximately one-hundred micrometers, thereby causing the groove to extend more than halfway through the thickness of the die between its opposing surfaces.

It has been determined that the structure and location of grooves for housing photonic fibers therefore may create weak points in the PIC die structure, as the extremely thin boundary between the bottom of the groove and an opposing surface of the die is more likely to crack than other portions of the PIC die. The risk of cracking or other failures may be more pronounced when considering the need to etch or otherwise remove portions of semiconductor material from the initial PIC die structure during manufacture. Embodiments of the disclosure provide an interconnect structure for improving PIC die manufacturability, e.g., by providing components to increase the thickness of an interconnect region, and using an adhesive dielectric film to provide a combination of adhesive and metal-to-metal bonds in a single interconnect structure.

Figure 1:
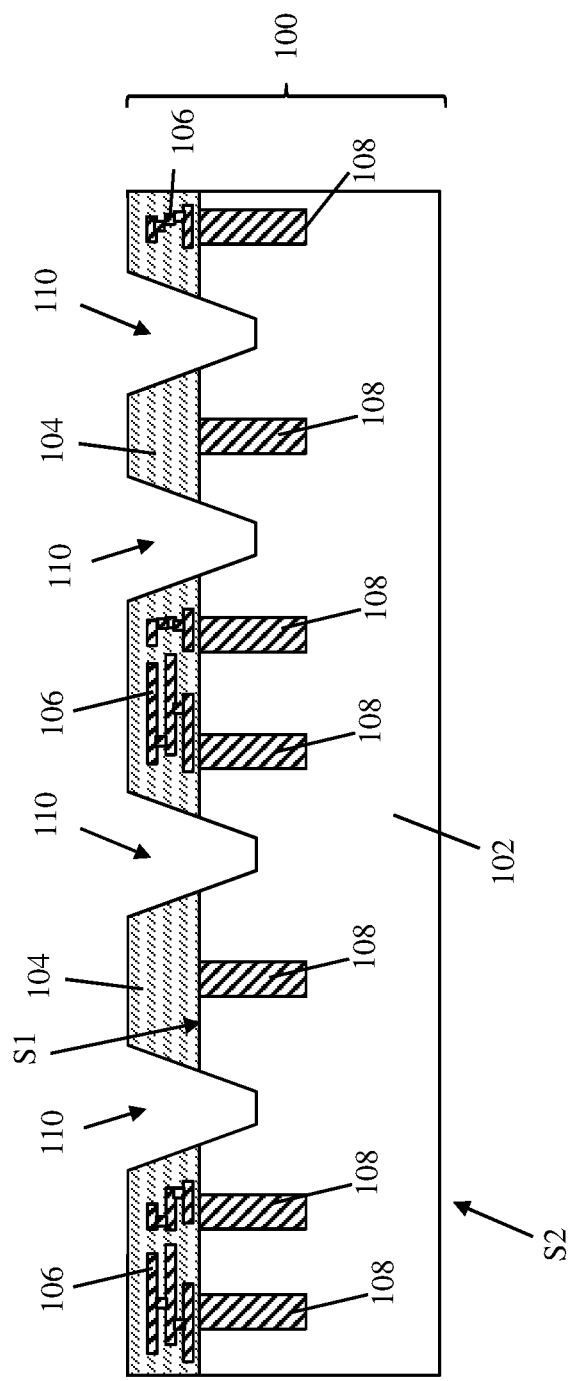
FIG. 1 shows a cross-sectional view of a precursor structure including a first die according to embodiments of the disclosure.

Referring to FIG. 1, fabrication techniques according to the disclosure may include providing a precursor structure 100, which may be manufactured or otherwise provided substantially in accordance with conventional PIC manufacturing techniques. Precursor structure may be used in the composition and/or manufacture of any currently known or later developed photonic device. As examples, precursor structure 100 may be used to form one or more passive photonic devices such as a wave guide, coupler, splitter, polarization splitter, rotator, filter, etc. According to further examples, precursor structure 100 may be used to form an active photonic device such as a modulator, detector, phase shifter, etc. Precursor structure 100 may include a first die 102 having a first surface S1 and an opposing second surface S2. First die 102 may be at least partially composed of any currently known or later developed semiconductor material, which may include without limitation: silicon, germanium, silicon germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances may include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

First die 102 may include a back-end-of-line (BEOL) dielectric region 104 formed on first surface S1, and BEOL wires 106 embedded therein to form electrical connections between various elements included within first die 102. BEOL dielectric region 104 may include one or more currently known or later developed materials for providing electrical insulation, e.g., silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. BEOL wires 106 may be arranged in successive layers, with vias extending through BEOL dielectric region 104. The configuration of BEOL wires 106 in first die 102 illustrated in FIG. 1 illustrates an example arrangement, and alternative arrangements of BEOL wires 106 are contemplated in embodiments of the disclosure.

As shown, first die 102 may include one or more first TSV metals 108 therein. Each first TSV metal 108 may extend at least partially through first die 102, such that the end(s) of first TSV metal(s) 108 is/are below second surface S2 of first die 102. First TSV metal(s) 108 may be in contact with and electrically connected to one or more conductive portions of BEOL wires 106. First TSV metal(s) 108 may generally include one or more electrically conductive materials etched through semiconductor materials in first die 102 to provide a wafer-to-wafer interconnect scheme compatible with 3D wafer-level packaging, e.g., electrical connections to underlying structures such as external structures or devices. Each first TSV metal 108 may be used to connect circuit elements on first die 102, e.g., portions of BEOL wires 106, to other components. First TSV metal(s) 108 may be formed of copper or other metals suitable for serving as a conductive wire in an IC structure. First TSV metal(s) 108 may also include substantially annular refractory metal liners (not shown) disposed circumferentially about the metal(s) therein structure for providing additional electrical insulation and for preventing electromigration between TSV metal(s) 108 and adjacent semiconductor regions in first die 102. Such liners may be composed of any currently known or later developed conductive material, e.g., refractory metals such as ruthenium (Ru), tantalum (Ta), titanium (Ti), tungsten (W), iridium (Jr), rhodium (Rh) and platinum (Pt), etc., or mixtures of thereof. As shown in FIG. 1, each first TSV metal 108 may extend substantially vertically through first die 102. Although first TSV metal(s) 108 are shown to exhibit a substantially columnar shape in the accompanying FIGS., first TSV metal(s) 108 may have different structures in further embodiments. More generally, first TSV metal(s) 108 may have any desired shape or size, and may include, e.g., one or more electrically connected members which may each have linear profiles, curvilinear profiles, wave-type profiles, irregular profiles, etc.

First die 102 may also include a groove 110 directly below first surface S1. Groove 110 may be shaped to hold a photonic fiber therein, as discussed elsewhere relative to completed interconnect structures according to the disclosure. Embodiments of the disclosure may include forming groove(s) 110 by selective removing portions of first die 102, e.g., forming one or more photomasks (not shown) on non-targeted portions of first die 102 and etching materials not covered by the photomask(s) to form groove(s) 110. The photomask(s) may then be removed after groove(s) 110 are formed within first surface S1 of first die 102. Each groove may have a depth commensurate with the size of a photonic fiber to be housed therein, and to this extent may be structured such that the core of an optical fiber placed within groove(s) 110 is passively aligned with a corresponding PIC element (e.g., a wave guide) and thereby couple a light source to photonic circuitry positioned, e.g., elsewhere on first die 102. According to an example, groove(s) 110 may have a depth that is less than the total diameter of a particular fiber. For instance, groove(s) 110 may extend to a depth of approximately seventy-five μm and may be large enough to hold photonic fibers with a diameter of up to approximately one-hundred and twenty μm. As shown in FIG. 1, groove(s) 110 may exhibit a tapered or substantial V-shape configured to contact photonic fibers along a predetermined surface profile, but it is understood that the size, shape, interior surface profile, etc., of groove(s) 110 may differ between implementations.

Figure 2:
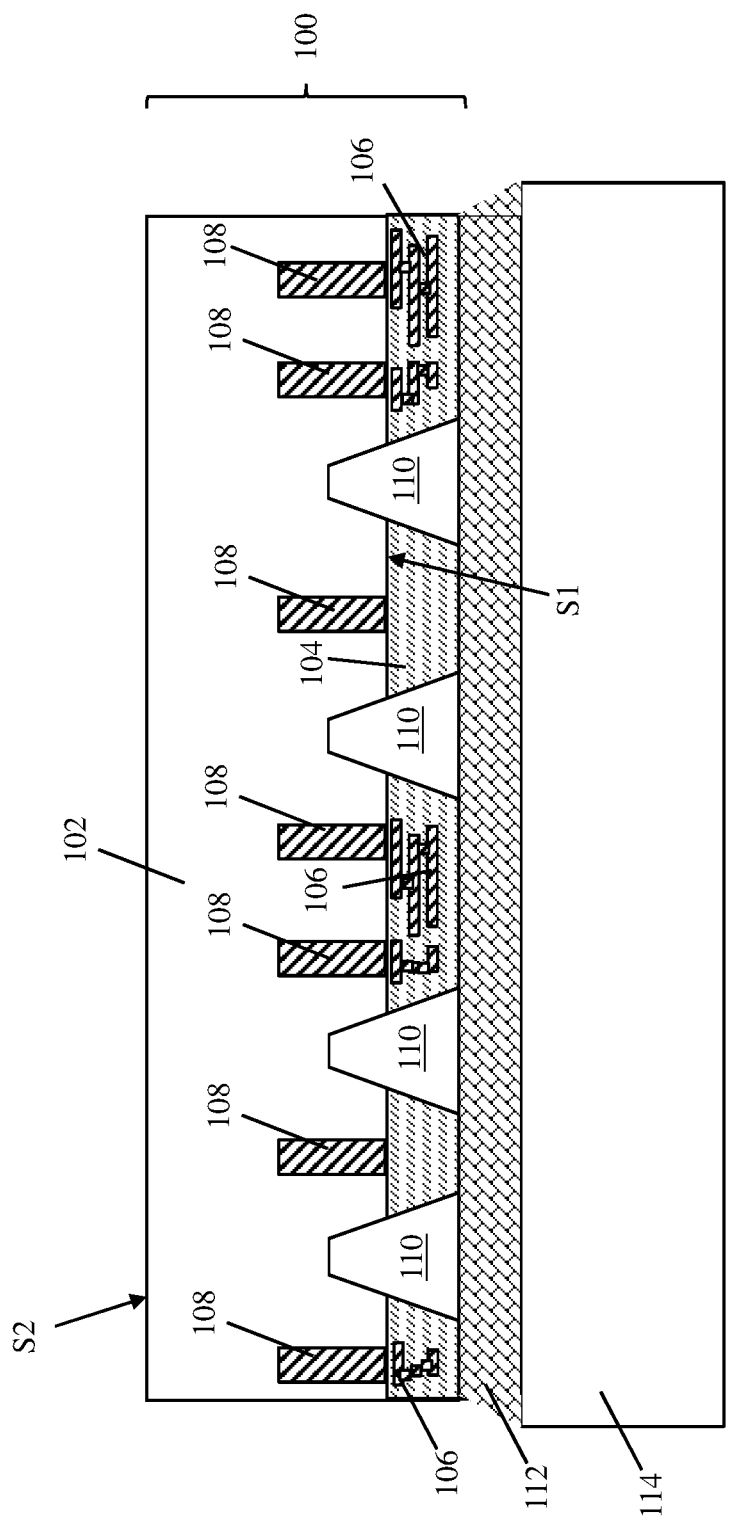
FIG. 2 shows a cross-sectional view of the precursor structure being mounted on an assembly plate according to embodiments of the disclosure.

Turning to FIG. 2, a fabricator may modify and/or prepare precursor structure 100 for continued processing according to the present disclosure. FIG. 2 shows precursor structure 100 flipped from the orientation of FIG. 1. Here, the physical characteristics of first die 102 at second surface S2 may be modified while first surface S1 remains substantially intact, e.g., after groove(s) 110 have been formed therein. For example, a temporary adhesive insulator 112 may be coated on first surface 112 of first die 102, and optionally within portions of groove(s) 110, e.g., by spin coating and/or film lamination processes for forming a polymer on a material. Groove(s) 110 are shown without adhesive insulator 112 solely for the sake of example, it is understood that adhesive insulator 112 may fill portions of groove(s) 110 in some cases before being removed in later processing steps. Adhesive insulator 112 may include one or more electrically insulating materials with adhesive properties. As examples, temporary adhesive insulator 112 may include one or more electrically insulating adhesive materials such as, e.g., urethane, silicone, and/or other adhesive resinous materials. A temporary wafer 114, alternatively identified in the art as a "handle wafer," may also be positioned on adhesive insulator 112 (e.g., by being mechanically placed thereon). In an embodiment, as shown, a fabricator may flip first die 102 upside-down to such that first surface S1 of first die 102 may be mounted vertically on the top of adhesive insulator 112 above temporary wafer 114. Adhesive insulator 112 thus may mechanically couple first die 102 to temporary wafer 114. Temporary wafer 114 may include any suitable material capable of being mechanically bonded to first die 102, e.g., one or more semiconductor materials included in the composition of first die 102 and/or may include one or more different materials (e.g., glass).

Figure 3:
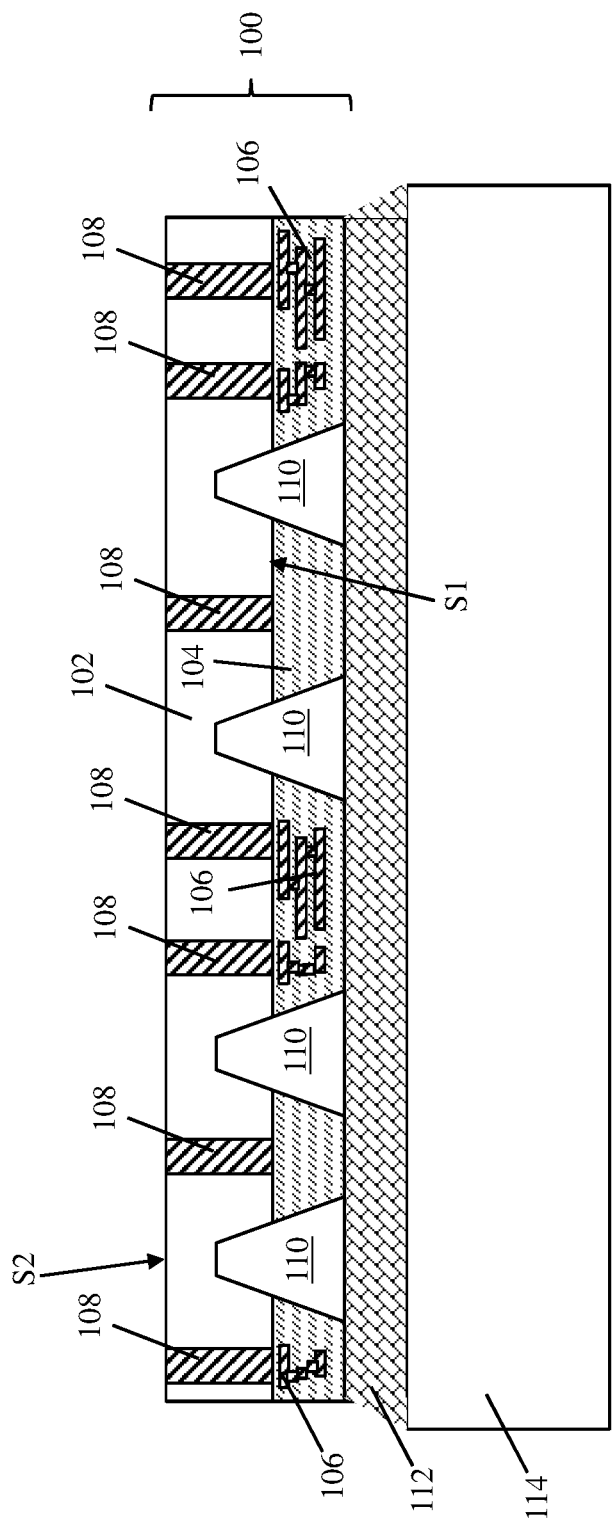
FIG. 3 shows a cross-sectional view of a surface of the precursor structure being etched to expose through-semiconductor-vias (TSVs) according to embodiments of the disclosure.

Turning to FIG. 3, excess semiconductor material may be removed from first die 102 to reveal first TSV metal(s) 108. Portions of first die 102 may be removed, e.g., by back-grinding, followed by dry etch, addition of a wafer backside dielectric material, e.g., by chemical vapor deposition (CVD) and chemical planar planarization (CMP) or other currently known or later-developed techniques for removing portions of a structure as depicted in FIG. 3. CMP generally refers to any process for removing layers of a solid material by chemical-mechanical polishing, e.g., for surface planarization and definition of metal interconnect patterns. After being processed as shown in FIG. 3, second surface S2 of first die 102 may become substantially coplanar with a vertical end of first TSV metal(s) 108. Thus, FIG. 3 illustrates a process for modifying first die 102 to expose an end of each TSV metal 108 at second surface S2 of first die 102. After removing portions of semiconductor material as depicted in FIG. 3, first die 102 may have a thickness of, e.g., approximately one-hundred micrometers (μm) between surfaces S1, S2 sides after being planarized.

Figure 4:
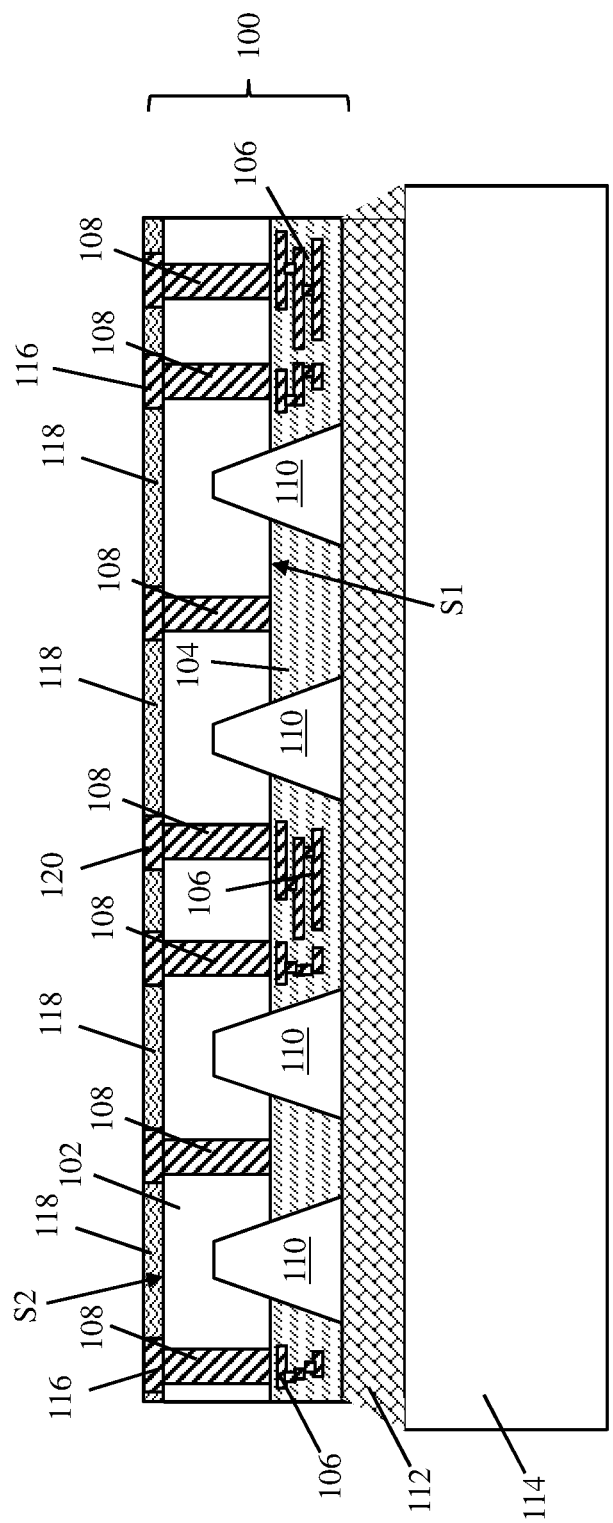
FIG. 4 shows a cross-sectional view of a first dielectric film and TSV bond pads being formed on the precursor structure according to embodiments of the disclosure.

Referring now to FIG. 4, first die 102 of precursor structure 100 may be processed to include materials for joining precursor structure 100 to other portions of an interconnect structure according to the disclosure. Interconnect structures formed by way of the methods disclosed herein may provide additional regions of semiconductor to protected first die 102 near groove(s) 110. To provide a greater amount of thickness, embodiments of the present disclosure rely upon a combination of adhesive dielectric and metal-to-metal bonds to join first die 102 to another semiconductor region.

As shown in FIG. 4, a set of first TSV bond pads 116 may each be positioned at the end of a respective first TSV metal 108 in first die 102. First TSV bond pads 116 may each be composed of, e.g., a conductive metal formed on first TSV metal 108 without substantially being formed on semiconductive regions of first die 102. Procedures of forming first TSV bond pads 116 may include, e.g., selectively depositing additional conductive metals on first TSV metal(s) 108 at second surface S2 of first die 102. As used herein, "deposition" or "depositing" a material (e.g., first TSV bond pads 116) may include any now known or later developed technique appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, in addition to other deposition processes currently known or later developed. Selective metal deposition processes may be advantageous in the case of forming first TSV bond pads 116, e.g., by allowing metal to form on portions of TSV metal(s) 108 without being formed on semiconductor materials of first die 102.

The combination of adhesive dielectric and metal-to-metal bonds may rely upon hybrid bonding techniques. In this context, "hybrid bonding" refers to a procedure for materially joining two components substantially along a single plane of contact, and with different types of bonds being formed for different materials along the single plane of contact. Conventional bonding techniques for joining two or more semiconductor die may rely solely on metal-to-metal bonds between pairs of vias located within the semiconductor dice. In hybrid bonding, by contrast, layers of adhesive dielectric material may also be formed on each die and bonded to each other together with the metal-to-metal bonds between various metals. Precursor substances for creating an adhesive dielectric layer and metal-to-metal bonds at second surface S2 of first die 102 are therefore shown in FIG. 4 and discussed herein.

The disclosure may also include mounting a first dielectric film 118 on second surface S2 of first die 102, e.g., after first TSV bond pad(s) 116 have been formed. First dielectric film 118 may include any currently known or later developed insulating material capable of adhesively bonding to other dielectric materials. To this extent, first dielectric film 118 may include one or more currently known or later developed dielectric adhesives, glues, etc. First dielectric film 118 thus may include one or more dielectric epoxy adhesives such as, e.g., benzocyclobutene (BCB), urethane, silicone, and/or other adhesive resinous materials. First dielectric film 118 may be formed on second surface S2 of first die 102, and then planarized (e.g., using CMP) such that the upper surface of first dielectric film 118 is substantially coplanar with that of first TSV bond pad(s) 116. After first dielectric film 118 is formed on first die 102, first TSV bond pad 118 may extend through first dielectric film 116, with exposed regions of first TSV bond pad(s) 116 and first dielectric film 118 being positioned at second end S2 of precursor structure 100 and first die 102.

Figure 5:
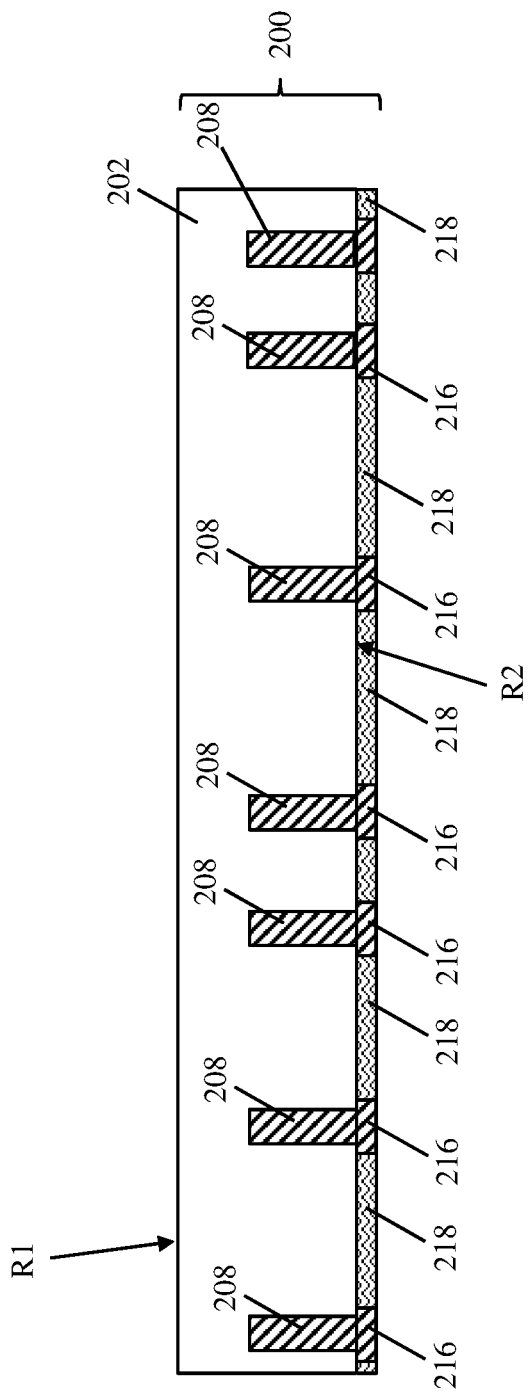
FIG. 5 shows a cross-sectional view of an interposer structure including a second die according to embodiments of the disclosure.

Turning to FIG. 5, an interposer structure 200 configured for use with precursor structure 100 (FIGS. 1-4) is shown. Interposer structure 200 may be provided or formed separately from precursor structure 100. The term "interposer" denotes the eventual location of interposer structure 200 between precursor structure 100 and other circuit components. Apart from the absence of wiring components (e.g., BEOL dielectric region 104, BEOL wires 106) and grooves 110, interposer structure 200 may have an outermost surface that is substantially a mirror image of an outermost surface of precursor structure 100. For instance, interposer structure 200 may include a second die 202 formed from one or more semiconductor materials, e.g., any of the example semiconductor substances described elsewhere herein relative to first die 102. Second die 202 may include a first surface R1 and an opposing second surface R2, and in some cases may have an identical thickness to that of first die 102 (e.g., approximately one-hundred μm). Precursor structure 200 may also include one or more second TSV metals 208 each having an end at second surface R2 of second die 202. Second TSV metal(s) 208 may be formed of any currently known or later developed metallic substance, including refractory metal liners (not shown), and in a specific example have the same composition as first TSV metal(s) 108 (FIGS. 1-4). The opposing end of second TSV metal(s) 208 may be buried within second die 202 underneath first surface R1.

Similar to the various bonding components described relative to precursor structure 100 (e.g., first TSV bond pad 116 (FIG. 4) and first dielectric film 118), interposer structure 200 may include various materials used to form a bond with precursor structure 100 at particular locations. For example, interposer structure may include one or more second TSV bond pads 216 formed on second TSV metal(s) 208 at second surface R2 of second die 202. Second TSV bond pad(s) 216 may be formed of any currently known or later developed conductive metal, e.g., one or more conductive metals discussed elsewhere herein relative to first TSV bond pad(s) 216. Second TSV bond pad(s) 216 may also be formed on respective second TSV metal(s) 208 by deposition, such that second TSV bond pad(s) 216 are positioned only on second TSV metal(s) 208. The arrangement and spacing of second TSV metal(s) 208 and second TSV bond pad(s) 216 may be a substantial mirror image of first TSV metal(s) 108 (FIGS. 1-4) and first TSV bond pad(s) 116. Thus, second TSV bond pad(s) 216 may be configured for substantial alignment with first TSV bond pad(s) 116 in subsequent manufacturing steps.

Interposer structure 200 may also include a second dielectric film 218 mounted on second surface R2 of second die 202 for creating an adhesive bond with other adhesive dielectric materials. Second dielectric film 218 may have the same material composition as first dielectric film 118 (FIG. 4) of precursor structure 100, or another adhesive dielectric material capable of adhering to first dielectric film 118. Second dielectric film 218 of interposer structure 200 may be formed in substantially the same manner as first dielectric film 218 or any other process effective to mount adhesive dielectric materials on exposed surfaces, e.g., second surface R2 of second die 202. Second dielectric film 218 may also be planarized after being formed, e.g., such that second dielectric film 218 is substantially coplanar with second TSV bond pad(s) 216.

Figure 6:
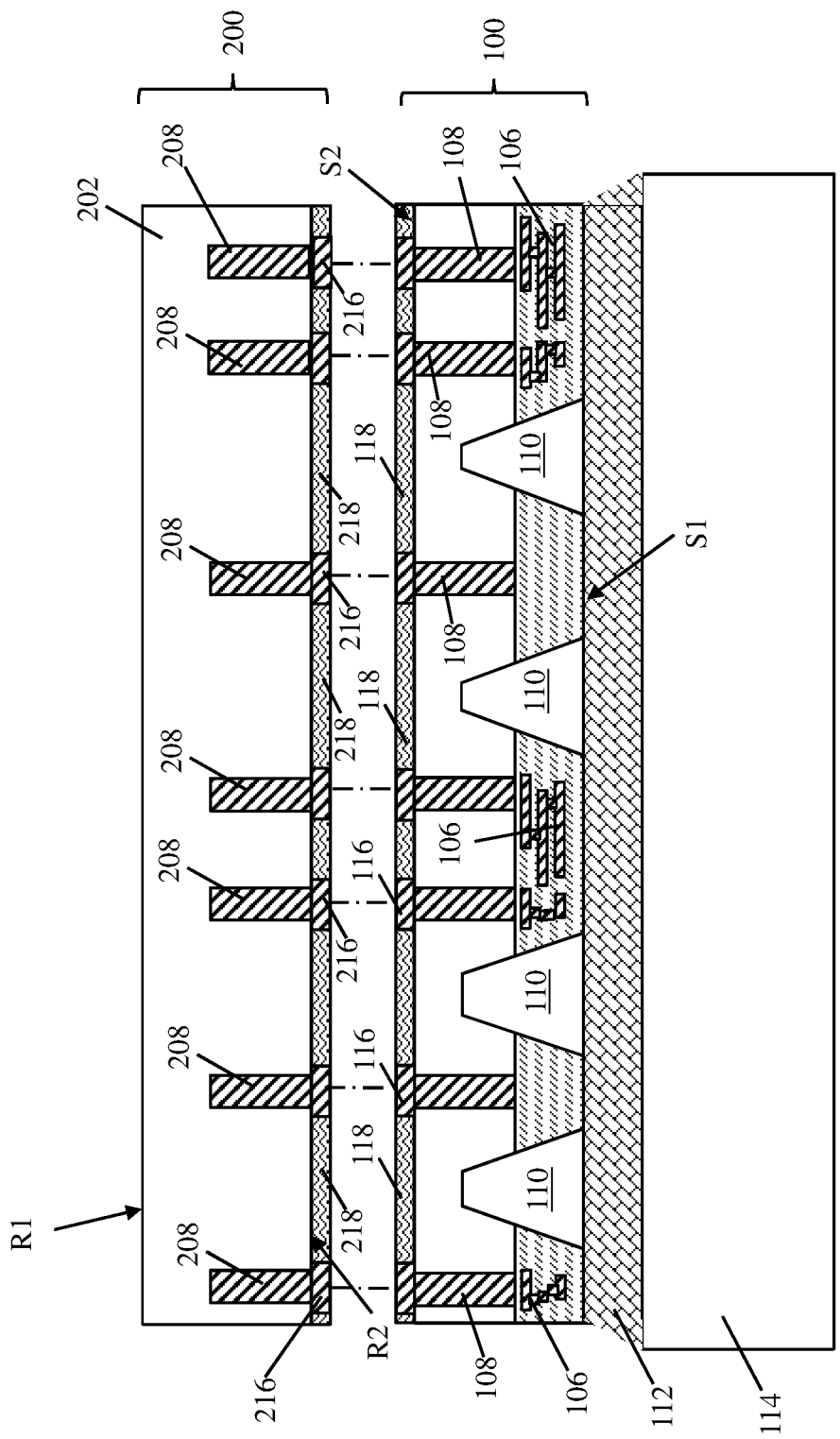
FIG. 6 shows a cross-sectional view of the interposer structure being substantially aligned with the precursor structure according to embodiments of the disclosure.

Turning to FIG. 6, processes of preparing to bond precursor structure 100 and interposer structure 200 together are discussed. As shown in FIG. 6, a fabricator may position interposer structure 200 over precursor structure 100, with second surface R2 of second die 202 facing downwardly toward second surface S2 of first die 102. At this point, each first TSV bond pad 116 in precursor structure 100 may be substantially aligned with corresponding second TSV bond pad(s) 216 of interposer structure 200. The substantial alignment between first and second TSV bond pad(s) 116, 118 is shown by phantom lines in FIG. 6. As used herein, the term "substantial alignment" or "substantially aligned" can refer to any alignment by which interposer structure 200 can be moved linearly (e.g., downwardly within the plane of FIG. 6) to create a physical interface between two elements, e.g., first and second TSV bond pad(s) 116, 118. Substantial alignment between precursor structure 100 and interposer structure 200 may also place first and second dielectric films 118, 218 in substantial alignment with each other.

Figure 7:
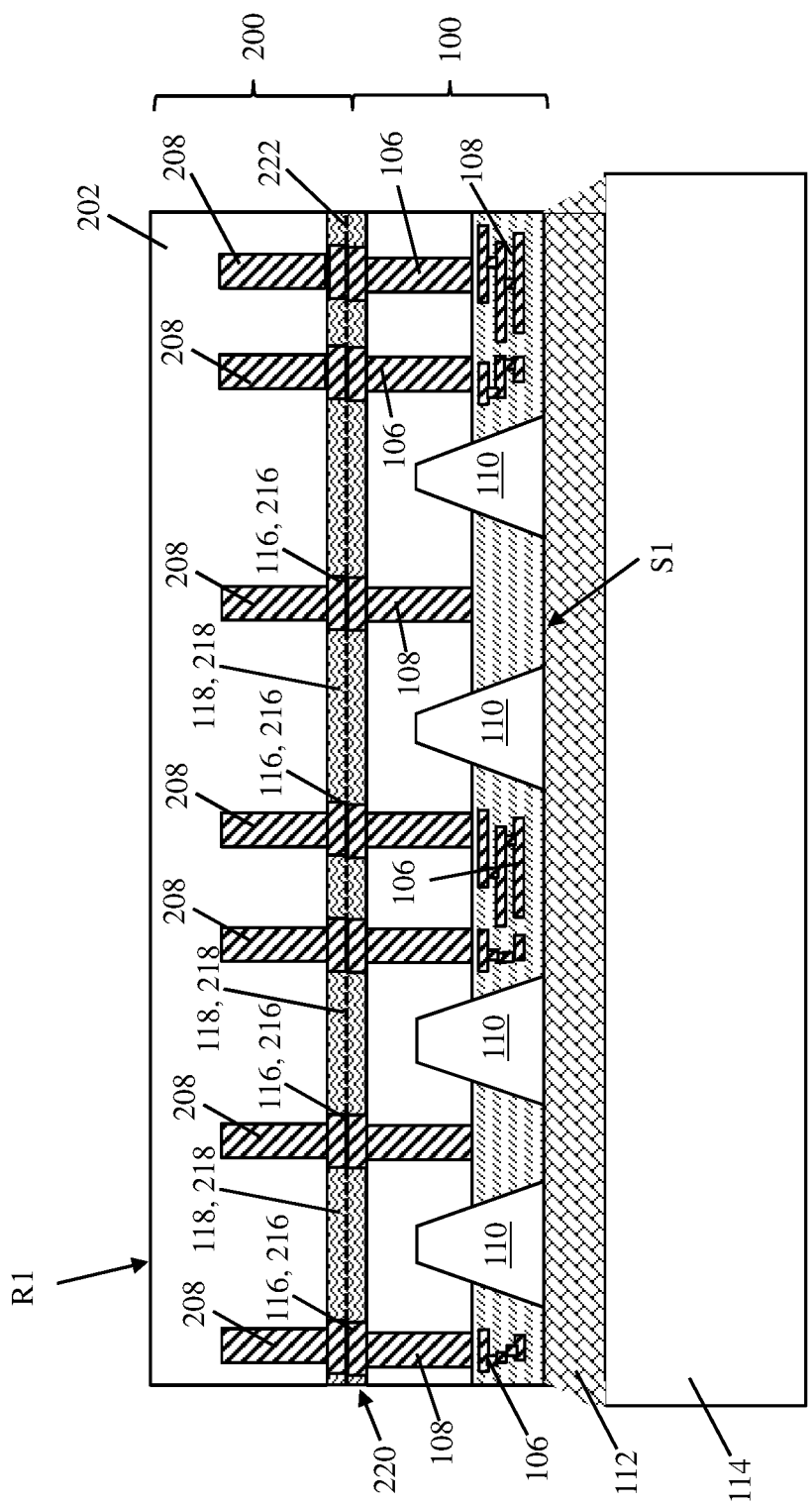
FIG. 7 shows a cross-sectional view of bonding the interposer structure to the precursor structure to form an interconnect structure according to embodiments of the disclosure.

Referring now to FIG. 7, the disclosure may include bonding precursor structure 100 and interposer structure 200 together after they have been substantially aligned. At this stage, components of precursor structure may be placed in contact with corresponding components of interposer structure 200, e.g., such that first and second TSV bond pads 116, 216 contact each other and dielectric films 118, 218 contact each other between first and second dies 102, 202. Although TSV bond pads 116, 216 and dielectric films 118, 218 have different compositions, the disclosure contemplates bonding these components together using a single application of heat. For example, a fabricator may apply heat and pressure to precursor structure 100 and interposer structure 200 to form bonds between contacting pairs of TSV bond pads 116, 216 and pairs of dielectric films 118, 218. In embodiments where dielectric films 118, 218 include a cured flowable oxide (e.g., a previously fluid material cured into a solid composition) such as BCB, precursor structure 100 and interposer structure 200 may be heated to a temperature of at least the melting point of dielectric films 118, 218 (e.g., greater than approximately sixty-five degrees Celsius (° C.)). Heating dielectric films 118, 218 to a temperature above their melting point will cause first and second dielectric films 118, 218 to flow into each other and bond together, thereby forming an adhesive dielectric layer 220 from the physical junction between first and second dielectric films 118, 218. During the same heating process, TSV bond pads 116, 216 may be compressed against each other (e.g., due to the adjacent bonding between dielectric films 118, 218), forming a metal-to-metal compressive bond at the junction between TSV bond pads 116, 216. Precursor structure 100 and interposer structure 200 may be subjected to elevated pressure along with the higher temperatures, e.g., to increase the forming of compressive metal-to-metal bonds where TSV bond pads 116, 216 contact each other. Physical bonding between TSV bond pads 116, 216 along with the bond between first and second dielectric films 118, 218 to form adhesive dielectric layer 220, may yield a substantially planar bonding interface 222 between the contacting surfaces of precursor structure 100 and interposer structure 200. Planar bonding interface 222 may represent a hybrid bonding interface between preliminary structure 100 and interposer structure 200. As a result of the bonding, second die 202 of interposer structure 200 increases the amount of physical material positioned over grooves 110 of precursor structure 100. The addition of interposer structure 200 thus allows continued manufacture of an interconnect structure without significant risk of cracking or failure within first die 102 near the location of groove(s) 110.

Figure 8:
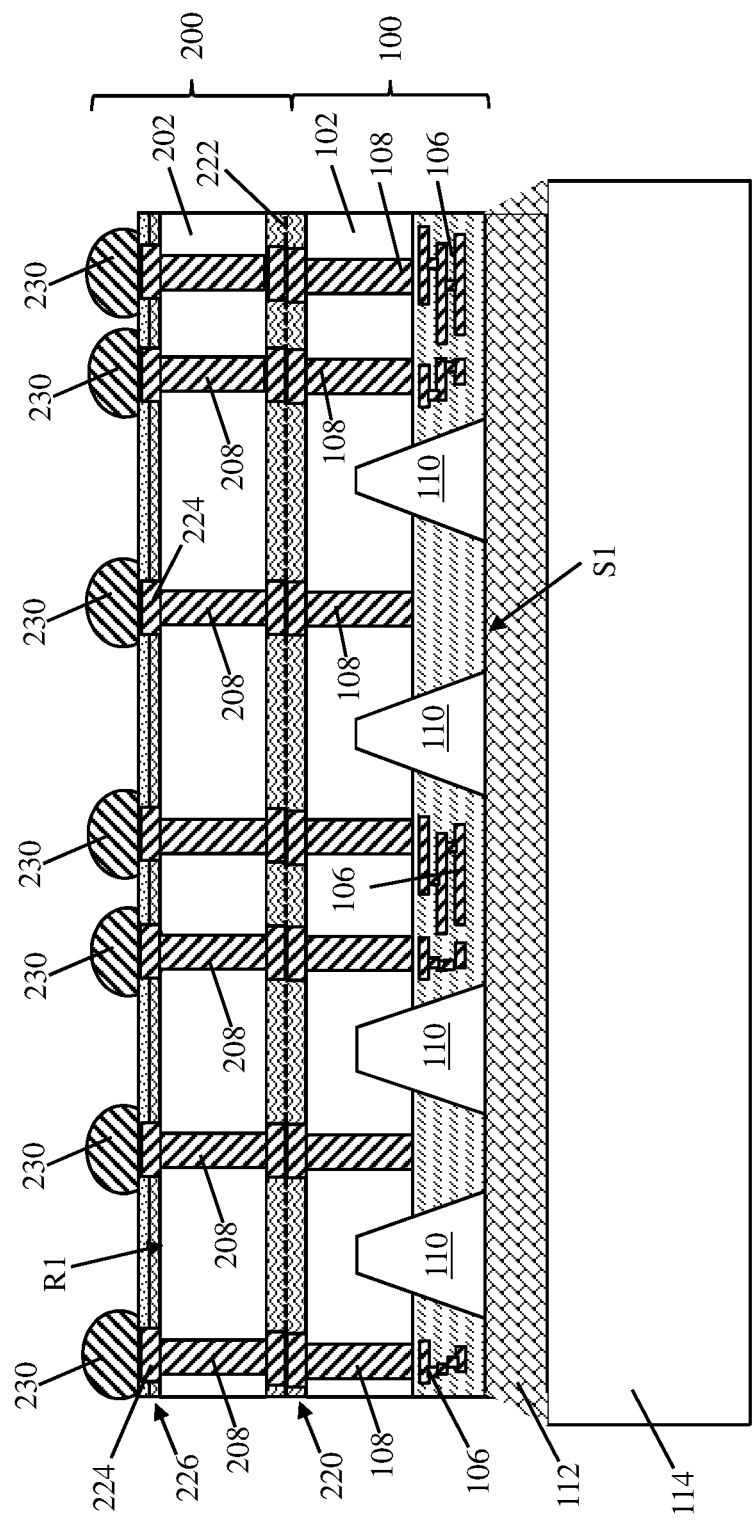
FIG. 8 shows a cross-sectional view of etching a portion of the interconnect structure and forming metal contacts thereon according to embodiments of the disclosure.

Proceeding to FIG. 8, remaining interconnect elements for joining BEOL wires 106 to other circuit components may be formed after precursor structure 100 has been bonded to interposer structure 200. For example, continued processing may include backgrinding of second die 202 at first surface R1 to uncover second TSV metal(s) 208. Thereafter, an under bump metallization (UBM) layer 224 can be formed on second TSV metal(s) 208, and a dielectric coating 226 may be formed on first surface R1 of second die 202. Dielectric coating 226 may structurally and electrically separate the semiconductor material of second die 202 from other materials formed thereon. After UBM layer 224 and dielectric coating 226 are formed, continued processing may include forming metal contact(s) 230 to second TSV metal(s) 208 of interposer structure 200 on UBM layer 224. Each metal contact 230 formed on interconnect structure 200 may be composed of, e.g., a solder bump including one or more solderable materials, conductive pillars (e.g., metallic pillars with conductive caps such as copper pillars capped with tin), and/or any currently known or later developed conductive material. According to an embodiment, metal contacts 230 may be formed from, e.g., material having tin and lead, tin without lead, tin with a residual of copper or silver, tin bismuth, tin indium, etc. The size of metal contacts 230 may be determined at least in part by the size (e.g., surface area, depth, etc.) of second die 202 and other structures to which metal contacts 230 are connected. For example, one or more metal contacts 230 may be of a different size to accommodate varying current carrying capacity and/or spacing requirements of a product.

Figure 9:
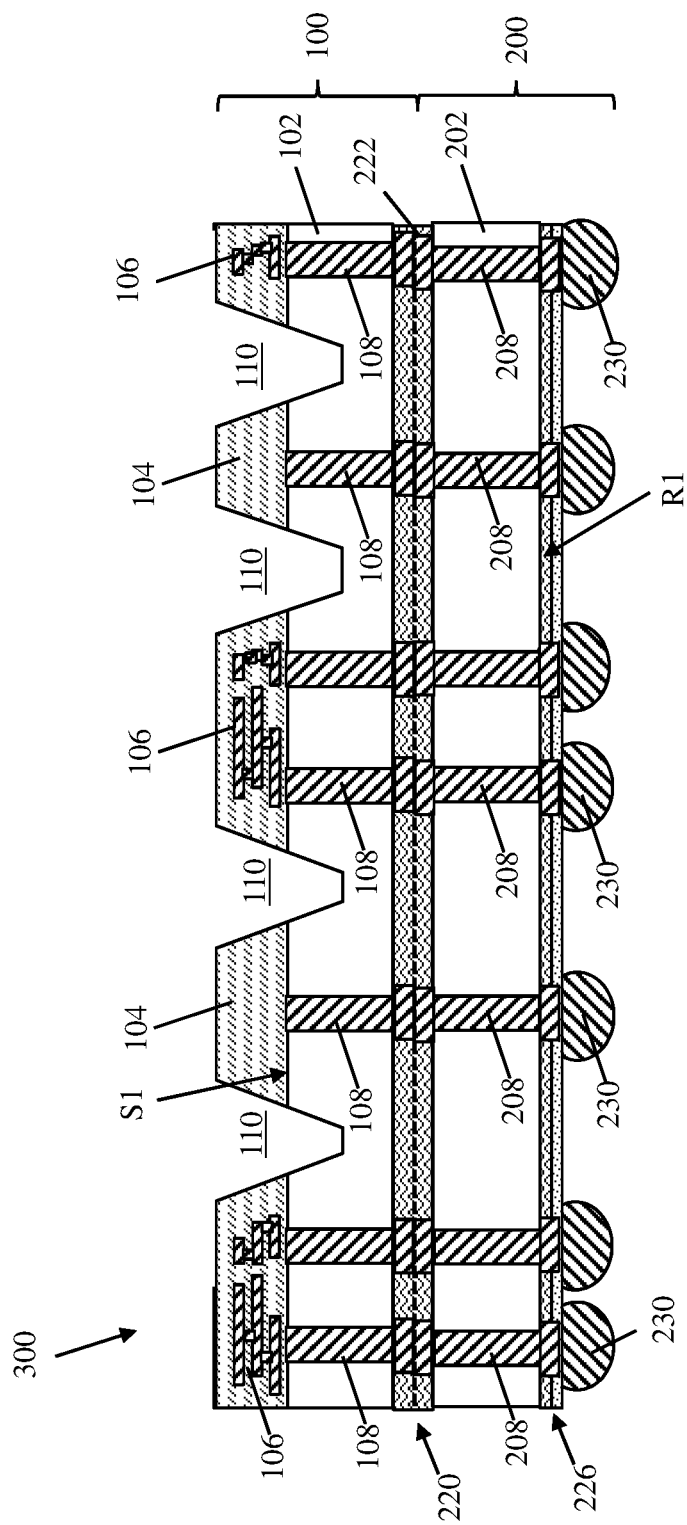
FIG. 9 shows a cross-sectional view of removing the interconnect structure from the assembly plate according to embodiments of the disclosure.

Turning to FIG. 9, the present disclosure may include removing precursor structure 100 and interposer structure 200 from temporary wafer 114 (FIGS. 2-8). In particular, temporary wafer 114 may be separated from precursor structure 100 to expose adhesive insulator 112 (FIGS. 2-8). Temporary wafer 114 may be removed from precursor structure 100, e.g., by any currently known or later-developed wafer separation technique (e.g., chemical and/or mechanical wafer separation). Adhesive insulator 112 may also be removed by any currently known or later-developed process for removing an insulative material from a structure, e.g., chemical dissolution, selective or non-selective etch, etc. Removing adhesive insulator 112 and temporary wafer 114 may allow metal contacts 230 of interposer structure 100 to be joined to a packaging structure pursuant to any currently-known or later developed process flow for joining circuits together at a soldered interconnect, e.g., a flip chip processing scheme as discussed herein. In any event, embodiments of the disclosure discussed herein may yield an interconnect structure 300 to be integrated in a larger IC structure.

Figure 10:
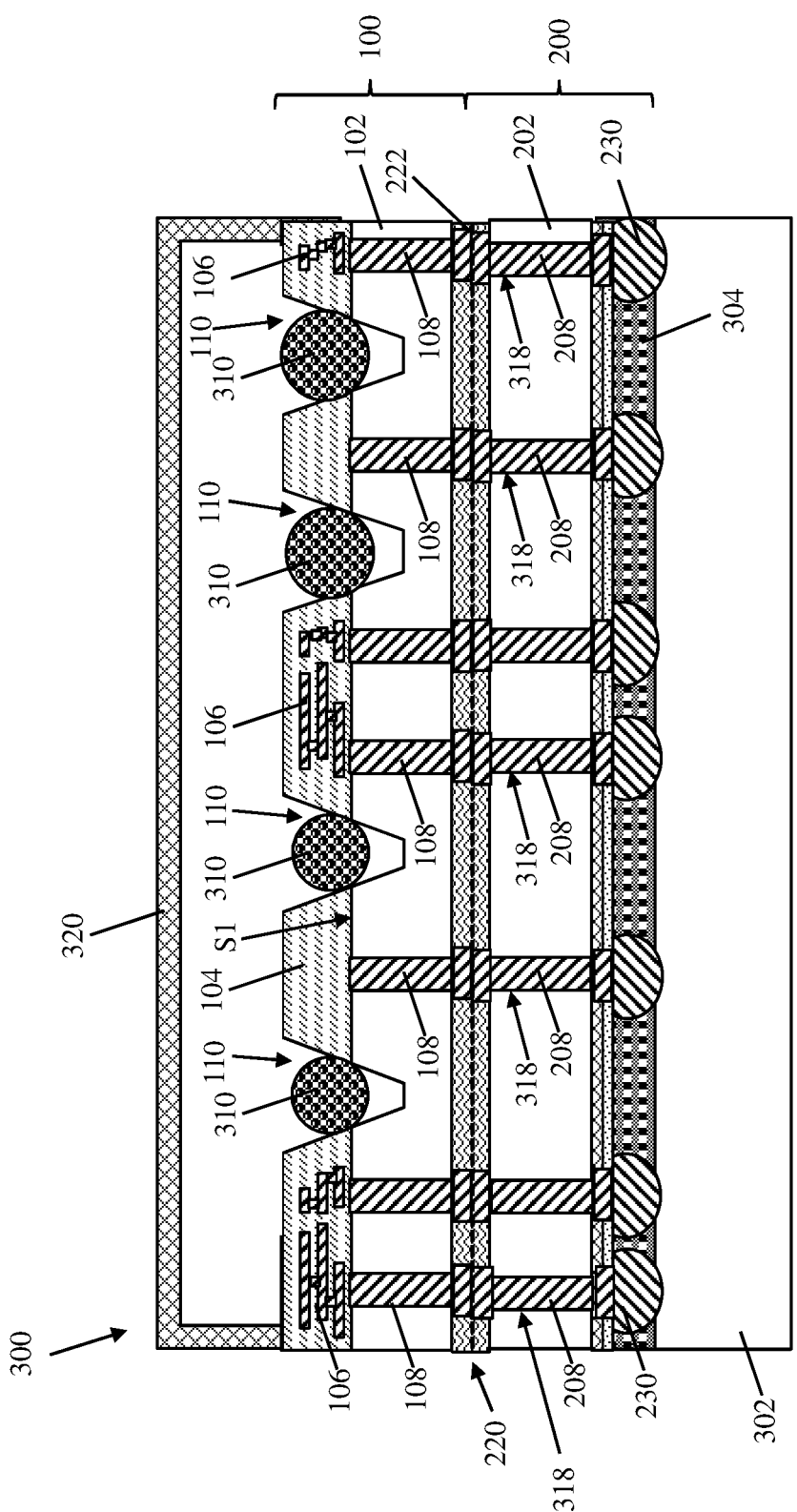
FIG. 10 shows a cross-sectional view of connecting the interconnect structure with metal contacts to another die, or package substrate, and mounting optical fibers to grooves within the first die according to embodiments of the disclosure.

Turning to FIG. 10, interconnect structure 300 is shown after be integrated with various structural elements to form an integrated circuit structure. As discussed herein, IC structure 300 may include interposer structure 200 mounted on precursor structure 100 along bonding interface 222 through TSV bond pads 116, 216 and adhesive dielectric layer 220. Metal contacts 230 may be positioned in contact with an assembly die 302 (e.g., through one or more bonding pads, not shown) positioned directly beneath interposer structure 200. At this stage, interconnect structure 300 may be diced into smaller portions along a group of scribe lines (not shown) before being coupled to assembly die(s) 302. Thus, interposer structure 200 is positioned directly between precursor structure 100 and assembly die 302. It is also understood that additional regions of metal (not shown), other than metal contacts 230, may optionally provide an additional mechanical connection between interposer structure 200 and assembly die 302. It is understood that metal contacts 230 may be completely or partially melted during fabrication to increase the mechanical and/or electrical bonding between interconnect structure 300 and circuit elements connected thereto. Further, it is understood that one or more external adhesive layers 304 may be formed in contact with and/or proximal to metal contacts 230 to increase structural bonding near metal contacts 230, e.g., as discussed herein relative to the bonding between first and second dielectric films 216, 218 to form adhesive dielectric layer 220.

Continued manufacturing of interconnect structure 300 may include, e.g., placing photonic fiber(s) 310, in respective groove(s) 110 of precursor structure 100. Photonic fiber(s) 310 may have a diameter of approximately, e.g., one-hundred and twenty μm to fit within groove(s) 110 with a depth of approximately seventy-five μm, as discussed elsewhere herein. Photonic fiber 310 may be composed of any fibrous medium capable of transmitting light therethrough, and as examples may be formed of, e.g., one or more glasses (e.g., silica glass), polymerous fibers, and/or other translucent or transparent fibrous materials. Photonic fiber(s) 310 may be housed within groove(s) 110 with the aid of one or more currently known or later developed adhesive materials, or may be shielded by a cover 320 formed on and above precursor structure 100 after photonic fiber(s) 310 have been placed in side groove(s) 110.

The various embodiments described herein may yield interconnect structure 300 configured to protect groove(s) 110 and nearby portions of first die 102 from cracking or failure, e.g., by increasing the amount of protective semiconductor material through a combination of adhesive dielectric bonding and metal-to-metal bonding. The above-noted bonding between TSV bond pad(s) 116,216 (FIGS. 6-7) can form a single TSV 318 extending through precursor structure 100 and interposer structure 200. Single TSV 318 can be made up of the previously-separated first TSV metal 108 (FIGS. 1-4, 6-9) and second TSV metal 208 (FIGS. 5-9), and may electrically connect BEOL wiring 106 to metal contact(s) 230. Portions of single TSV 318 thus may be positioned within adhesive dielectric layer 220 composed of the previously-separated first and second dielectric films 118 (FIGS. 4, 6, 7), 218 (FIGS. 5-7). Thus, interconnect structure 300 may mechanically join first die 102 to assembly die 302 through second die 202, without any portion of groove(s) 110 being positioned within second die 202. The various processes discussed herein may allow a manufacturer to integrate interposer structure 200 into a conventional process of forming PIC structures, and without modifying the structure and position of BEOL wiring 106, groove(s) 310, etc.

The method as described above is used in the fabrication of integrated circuit chips. The resulting integrated circuit chips may be distributed by the fabricator in raw wafer form (that is, as a single wafer that has multiple unstructured chips), as a bare die, or in a structured form. In the latter case the chip is mounted in a single chip structure (such as a plastic carrier, with leads that are affixed to a motherboard or other higher level carrier) or in a multichip structure (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An interconnect structure comprising:
a first die having a first surface and an opposing second surface, and a groove directly below the first surface of the first die;
an adhesive dielectric layer mounted to the opposing second surface of the first die;
a second die having a first surface mounted to the adhesive dielectric layer, and an opposing second surface, wherein the adhesive dielectric layer is positioned directly between the first and second dies; and
a through-semiconductor via (TSV) including a first TSV metal extending from the first surface of the first die to the adhesive dielectric layer, and a second TSV metal substantially aligned with the first TSV metal and extending from the adhesive dielectric layer to the opposing second surface of the second die, wherein the TSV includes a metal-to-metal bonding interface between the first and second TSV metals within the adhesive dielectric layer.

2. The interconnect structure of claim 1, wherein a depth of the groove extends more than halfway through a thickness of the first die from the first surface of the first die to the opposing second surface of the first die.

3. The interconnect structure of claim 2, wherein the thickness of the first die is approximately one-hundred micrometers (μm), and wherein a depth of the groove is approximately seventy-five μm.

4. The interconnect structure of claim 1, wherein a thickness of the first die between the first and second surfaces thereof is substantially equal to a thickness of the second die between the first and second surfaces thereof.

5. The interconnect structure of claim 1, wherein the adhesive dielectric layer includes a cured flowable dielectric material.

6. The interconnect structure of claim 1, further comprising a photonic fiber positioned within the groove of the first die, wherein a diameter of the photonic fiber is approximately one-hundred and twenty nanometers (nm).

7. The interconnect structure of claim 1, wherein the adhesive dielectric layer includes:
a first dielectric film bonded to the opposing second surface of the first die;
a second dielectric film adhesively bonded to the first dielectric film on a surface of the first dielectric film opposite the first die, wherein an adhesive bonding interface between the first and second dielectric films is substantially coplanar with the metal-to-metal bonding interface between the first and second TSV metals.

8. An interconnect structure comprising:
a first die having a first surface and an opposing second surface, and a groove within the first surface of the first die;
an adhesive dielectric layer mounted to the opposing second surface of the first die, wherein the adhesive dielectric layer includes:
   a first dielectric film bonded to the opposing second surface of the first die, and
   a second dielectric film bonded to the first dielectric film opposite the first die, wherein an adhesive bonding interface between the first and second dielectric films extends substantially in parallel with the opposing second surface of the first die;
a first through-semiconductor via (TSV) metal extending from the first surface of the first die to the adhesive bonding interface of the adhesive dielectric layer;
a second die having a first surface mounted on the second dielectric film of the adhesive dielectric layer, and an opposing second surface; and
a second TSV metal substantially aligned with the first TSV metal and extending from the adhesive bonding interface of the adhesive dielectric layer to the opposing second surface of the second die, wherein a metal-to-metal bonding interface joins the first TSV metal to the second TSV metal.

9. The interconnect structure of claim 8, further comprising a metal contact formed on the second TSV metal at the opposing second surface of the second die.

10. The interconnect structure of claim 8, further comprising a photonic fiber positioned within the groove of the first die, wherein a diameter of the photonic fiber is approximately one-hundred and twenty nanometers (nm).

11. The interconnect structure of claim 8, wherein the adhesive dielectric layer includes a cured flowable dielectric material.

12. The interconnect structure of claim 8, wherein the adhesive bonding interface is substantially coplanar with the metal-to-metal bonding interface to define a substantially planar hybrid bonding interface.

* * * * *